United States Patent [19]

Oppelt et al.

[11] Patent Number: 4,725,782
[45] Date of Patent: Feb. 16, 1988

[54] ANTENNA STRUCTURE FOR EXCITING AND/OR RECEIVING RF FIELDS IN AN NMR TOMOGRAPHY APPARATUS

[75] Inventors: Ralph Oppelt, Uttenreuth; Wilhelm Duerr, Erlangen, both of Fed. Rep. of Germany

[73] Assignee: Siemens Aktiengesellschaft, Berlin and Munich, Fed. Rep. of Germany

[21] Appl. No.: 36,797

[22] Filed: Apr. 10, 1987

[30] Foreign Application Priority Data

May 20, 1986 [DE] Fed. Rep. of Germany ....... 3616705

[51] Int. Cl.$^4$ .......................................... G01R 33/20
[52] U.S. Cl. ..................................... 324/318; 324/322
[58] Field of Search ................ 333/219, 223; 324/318, 324/319, 322; 128/653

[56] References Cited

U.S. PATENT DOCUMENTS

| | | | |
|---|---|---|---|
| 4,506,224 | 3/1985 | Krause | 324/319 |
| 4,591,818 | 5/1986 | Butson | 324/320 |
| 4,594,566 | 6/1986 | Maudsley | 333/223 |
| 4,642,569 | 2/1987 | Hayes et al. | 324/318 |
| 4,667,160 | 5/1987 | Krause | 324/318 |
| 4,680,550 | 7/1987 | Krause | 324/318 |

FOREIGN PATENT DOCUMENTS

| | | |
|---|---|---|
| 0153531 | 5/1985 | European Pat. Off. . |
| 0156042 | 3/1986 | European Pat. Off. . |
| 0180121 | 7/1986 | European Pat. Off. . |

*Primary Examiner*—Michael J. Tokar
*Attorney, Agent, or Firm*—Hill, Van Santen, Steadman & Simpson

[57] ABSTRACT

An antenna structure for exciting a substantially homogeneous magnetic RF field and/or for receiving RF signals in a nuclear magnetic resonance tomography apparatus includes a hollow cylindrical conductor sheath which is substantially transmissive at low frequencies for gradient magnetic fields, a number of conductor units within the conductor sheath, each conductor unit including at least one conductor element, and RF reflector disposed at the end faces of the antenna structure and an external energy feed or reception device. In this antenna structure, the current drop which increasingly occurs toward the end faces of the antenna structure is largely compensatable by shaping the electrically conductive cross-section of the conductor units so as to decrease symmetrically from an axial center of the antenna structure moving toward the end faces of the structure. The conductor units thus have a largest cross-section at a center of the antenna structure, and a smallest cross-section at the end faces.

14 Claims, 4 Drawing Figures

ANTENNA STRUCTURE FOR EXCITING AND/OR RECEIVING RF FIELDS IN AN NMR TOMOGRAPHY APPARATUS

BACKGROUND OF THE INVENTION

1. Field of the Invention

The present invention is directed to an antenna structure for exciting a substantially homogeneous magnetic RF field and/or for receiving RF signals in a nuclear magnetic resonance tomography apparatus.

2. Description of the Prior Art

An antenna structure is disclosed in German OS No. 31 33 432, corresponding to U.S. Pat. No. 4,506,224, for use in a nuclear magnetic resonance tomography apparatus for exciting a substantially homogeneous magnetic RF field and/or for receiving corresponding RF signals. This known structure includes a hollow cylindrical conductor sheath which is transmissive for low frequencies for gradient magnetic fields, a plurality of conductor units forming at least one conductor pair and respectively consisting of one or more conductor elements combined into a group, the conductor groups extending in a longitudinal direction of the apparatus within the conductor sheath, reflectors at the end faces of the structure which reflect the waves of the RF field, and an external energy feed or reception means.

Imaging diagnostic methods have been developed in the field of medical technology wherein computed or measured integral resonance signals from nuclei of a selected chemical element of, for example, a human body or body organ, are analyzed. An image similar to an x-ray tomogram obtained by computer tomography can then be constructed from the three-dimensional spin density distribution and/or relaxation time distrubution thus acquired. Methods are generally known under the designations "nuclear magnetic resonance (NMR) tomography" or "zeugmatography." For nuclear magnetic resonance tomography, a strong magnetic field generated by a fundamental field magnet is required. This fundamental field must be highly uniform in the imaging, (examination) region. A body or organ to be examined is introduced into this region along an axis which usually coincides with the orientation axis of the fundamental magnetic field. The fundamental magnetic field is superimposed with stationary and/or pulse fields referred to as gradient fields. In order to excit individual atomic nuclei in the body or organ to execute a precessional motion, a special antenna installation is needed by means of which a RF magnetic alternating field (RF field) of adequate uniformatiy can be briefly excited. Under given conditions, this antenna installation can also be used for receiving the RF resonance signals thus elicited.

RF fields having high frequencies of 20 MHz and more can be excited or received with the RF antenna structure disclosed in the aforementioned U.S. Pat. No. 4,506,224. For this purpose, the antenna installation contains an outer hollow cylindrical element of non-magnetic material having good electrical conductivity. This antenna element is a conductor sheath surrounding a plurality of inner conductor elements forming at least one conductor pair. These inner conductor elements are disposed on an imaginary cylindrical surface around which the sheath is concentrically disposed at a predetermined distance. The $\lambda/2$ resonance condition for wave propagation having the aforementioned extremely high frequency is then set for the inner conductor elements (at least two in number), which are operated in the push-pull mode, and on the conductor sheath. Equiphase oscillating fields in the form of standing waves on the conductors are formed within the full examination volume of interest. To this end, the beginning and end of the two inner conductor elements are symmetrically electrically shorted by means such as, for example, predetermined capacitances which reflect the waves of the RF fields.

Because the outer antenna element forming a common conductor sheath around the inner conductor elements in the known structure is substantially transmissive for low-frequencies, the low-frequency gradient fields can propagate unimpeded in the examination volume.

In this known antenna structure, examination of the current distribution along the conductor elements at the desired $\lambda/2$ resonance shows a gradual decrease of the current toward the end faces of the conductors which is symmetrical relative to the center of the conductor. A current distribution curve can be seen which is roughly cosine-shaped. If one wishes to provide higher resonant frequencies or shorter wave lengths, using the same axial length of the antenna structure, a correspondingly smaller electrical shorting is required. This causes, however, an even more pronounced current drop along the conductor elements toward the end faces, such a pronounced current drop being undesired in view of maintaining a good field homogeneity.

A solution to this problem is suggested in German OS No. 33 47 597 wherein the non-homogenous current distribution can be at least partially compensated by bending the rod-shaped inner conductor elements to a barrel-shape, so that their distance from the outer hollow cylindrical conductor sheath is larger at the resonator ends than at the resonator center. The corresponding shaping of the inner conductor elements as well as their exact location within the outer conductor sheath, however, are relatively complex.

SUMMARY OF THE INVENTION

It is an object of the present invention to provide an antenna structure suitable for use in an NMR tomography apparatus wherein the non-homogeneous current distribution is substantially eliminated using a simple design and arrangement of the inner condutor elements.

The above object is acheived in accordance with the principles of the present invention in an antenna structure of the type described wherein the inner conductor elements have an electrically conducting cross-section which symmetrically decreases from a center of the resonator toward each end face of the resonator.

The characteristic impedance between each conductor unit (which may comprise one or more conductor elements) and the hollow cylindrical conductor sheath surrounding the conductor unit can be varied in a simple manner by selective graduation of the conductor cross section. A more uniform current distribution can thus be achieved, given unaltered phase velocity, because the characteristic impedance bewteen these portions of the antenna structure increases toward the end faces due to the corresponding decrease in the conductor cross-section. The individual conductor elements are simple to prefabricate, and can be precisely arranged within the hollow cylindrical conductor sheath without difficulty.

DESCRIPTION OF THE PREFERRED EMBODIMENTS

Figure 1:
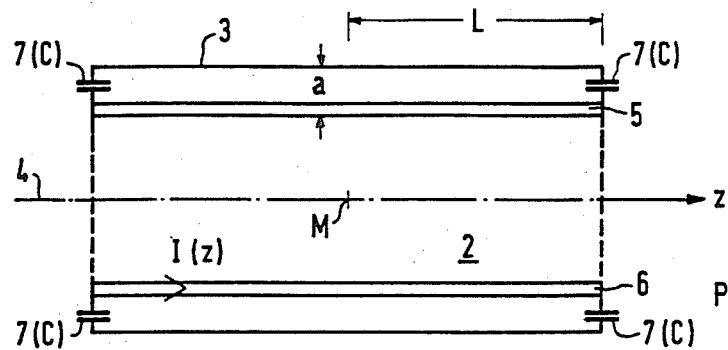
FIG. 1 is a schematic representation of a known antenna structure for use in an NMR tomography apparatus.

A longitudinal section through an RF antenna installation as described in U.S. Pat. No. 4,506,224 is shown in FIG. 1. This known antenna structure, generally referenced at 2, includes a conductor sheath 3 of electrically conductive material which is in the form of a hollow cylinder with a cylindrical axis 4 extending in the direction of the z-coordinate. The sheath 3 is transmissive at low frequencies for gradient magnetic fields. The sheath 3 surrounds a plurality of conductor units forming at least one conductor pair. In accord with the selected embodiment, these conductor units each consist of a single conductor element. Conductor units consisting of a plurality of conductor elements combined into groups, however, may alternatively be used. In the embodiment of FIG. 1, two straight rod-like conductor elements 5 and 6 are employed which are disposed opposite each other on an imaginary cylindrical generated surface concentric with the cylinder axis 4. The constant distance between the cylindrical generated surface and the conductor sheath concentric therewith is referenced "a'." The conductor elements 5 and 6 have substantially the same axial length 2L as the outer conductor sheath 3. The conductor elements 5 and 6 are coupled to the conductor sheath 3 at their respective end faces through capacitors 7 each having a capacitance C. A symmetrically capacitvely shorted $\lambda/2$ resonator having a length 2l is thus obtained with respect to the center M. The current flowing through the conductor elements 5 and 6 in the resonant condition is referenced I.

Figure 2:
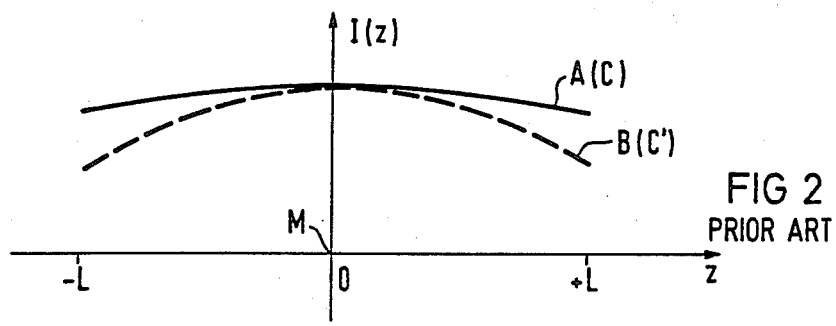
FIG. 2 is a graph of the current distribution in the known structure of FIG. 1 for use in explaining the problem in the art.
Figure 3:
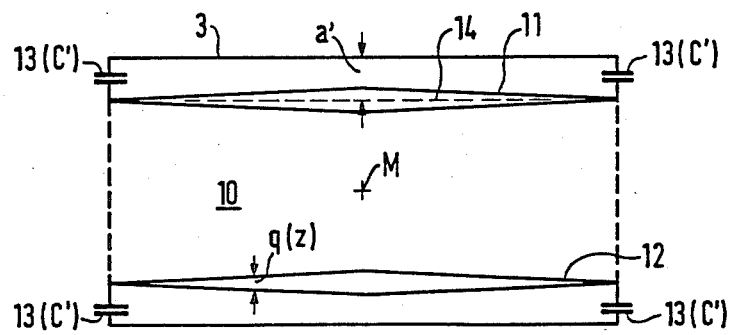
FIG. 3 is a schematic representation of an embodiment of an antenna structure for an NMR tomography apparatus constructed in accordance with the principles of the present invention.

The dependency of the current I on the coordinate z along the axis 4 can be seen in the graph of FIG. 2. The zero point of the coordinate z is placed at the axial center M of the antenna structure. Given a specific resonant frequency $f_1$, for which the antenna structure is initially designed, the current distribution I(z) then exhibits a curve A(C) along a conductor element or conductor unit which, among other things, is dependent on the resonance frequency $f_1$ and on the capacitance C. If capacitances C' having at lower values than C are selected for the structure shown in FIG. 1, a new resonant frequency $f_2$, which is higher than the original resonant frequency $f_1$, results. A different current distribution I(z) then is present in the individual conductor elements for this new resonant frequency $f_2$, as indicated by the curve B(C') shown with dashed lines in FIG. 2. Comparing curve B(C') to curve A(C), it can be easily seen that the current drop toward the end faces at $z=+L$ and $z=-L$ of the antenna structure becomes more pronounced with increasing resonant frequency. This undesired effect can be largely compensated with the structure shown in FIG. 3 in accordance with the principles of the present invention. The antenna structure 10 shown in FIG. 3 has a conductor sheath of the type known in the art and described in the aforementioned U.S. Pat. 4,506,224. The antenna structure of FIG. 3 differs from the known structure, at least in part, on the basis of the design of the conductor units. In the embodiment of FIG. 3, each conductor unit is formed by a single straight conductor element, the two elements 11 and 12 being disposed opposite each other within the sheath 3. The conductor elements 11 and 12 are electrically shorted by capacitors 13, each having a capacitances C'. The capacitors 13 are disposed at the end faces of the conductor elements 11 and 12 at $z=+L$ and $z=-L$, and are disposed symmetrically with respect to a center M of the structure disposed at $z=0$. The conductor elements 11 and 12 each have an electrically conducting cross-section q(z) which preferably symmetrically tapers from the center of the structure to the opposite end faces of the structure. In the embodiment of FIG. 3, the conductor elements 11 and 12 thus have a double conicak shape. Their center axis 14, shown as a dash line, preferably has a constant distance a' from the conductor sheath 3.

The advantage achieved by tapering the conductor cross-section is that the characteristic impedance between the individual conductor elements and the outer conductor sheath increases toward the end faces. The current decrease along the conductor elements toward these end faces is then correspondingly lower, so that the longitudinal field homogeneity is improved.

Other conductor shapes having a decreasing cross-section of the electrically conductive material can be used instead of the conical shape described above. The decreasing cross-section may be continuous or in steps. Thus, for example, strip conductors may be used as the conductor elements 11 and 12 with the width of the respective strips decreasing in corresponding fashion toward the end faces. The respective conductor width and the thickness of the respective strips define the electrically conductive cross-section q(z).

In order to minimize any disturbances on the gradient fields, it is sufficient if only the surfaces of the conductor elements consist of conductive material.

The inner conductor units can be formed by single elements, such as 11 and 12 in FIG. 3, or can be formed by groups consisting of a plurality of conductor elements conducted in parallel. If a plurality of conductor elements are used, not all conductor elements in a conductor unit need have a decreasing cross-section; it is sufficient if only selected conductor elements of a conductor unit have a decreasing cross-section if the desired current distribution can be obtained, with the remaining conductor elements having a constant conductor cross-section. Because some of the conductor elements have a decreasing cross-section, however, the total conductive cross-section for the conductor unit will nonetheless decrease, which is sufficient to achieve the desired results.

Figure 4:
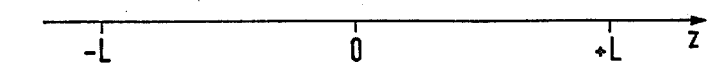
FIG. 4 is a schematic representation of another embodiment of an antenna structure for an NMR tomography apparatus constructed in accordance with the principles of the present invention.
Figure 4:
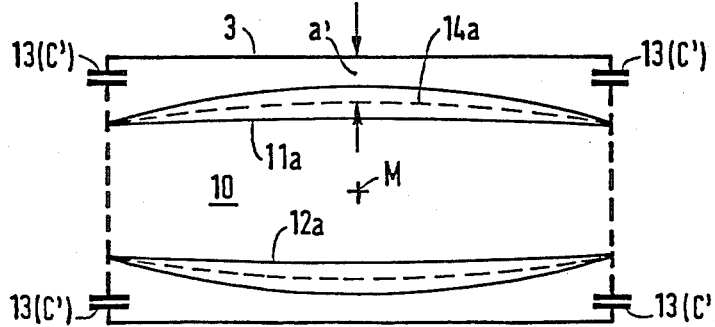

It is also possible under certain conditions to combine the conductor elements having decreasing cross-section disclosed herein with the concept of distancing variation disclosed in the aforementioned German OS No. 33 47 597. Such an embodiment is schematically shown in side view in FIG. 4. The center axis 14a of the conductor elements 11a and 12a in this embodiment is vaulted barrel-like, so that the conductor elements are disposed a smaller distance a' from the conductor sheath in the region of the axial center (z=0) of the structure 10 than extreme ends (z= +L or z= −L).

Although modifications and changes may be suggested by those skilled in the art it is the intention of the inventors to embody within the patent warranted hereon all changes and modifications as reasonably and properly come within the scope of their contribution to the art.

We claim as our invention:

1. In an antenna structure for exciting a substantially homogeneous magnetic RF field and/or for receiving corresponding RF signals in a nuclear magnetic resonances tomography apparatus, said antenna structure having a hollow cylindrical conductor sheath transmissive at low frequencies for gradient magnetic fields, a plurality of conductor units forming at least one conductor pair disposed within said conductor sheath and extending in a longitudinal direction of the apparatus, and means at the end faces of the conductor units for reflecting the waves of the RF field, the improvement comprising:
   each conductor unit having an electrically conductive cross-section which decreases substantially symmetrically from an axial center of said antenna structure toward said end faces of said conductor units.

2. The improvement of claim 1, wherein said conductor units have a continuously decreasing electrically conductive cross-section.

3. The improvement of claim 1, wherein said conductor units have a stepped decreasing electrically conductive cross-section.

4. The improvement of claim 1, wherein each conductor unit consists of a single conductor element, and wherein said conductor elements are double conically shaped.

5. The improvement of claim 1, wherein each of said conductor units consists of a single conductor element, and wherein said conductor elements are strip-shaped.

6. The improvement of claim 1, wherein each conductor unit consists of a plurality of conductor elements, and wherein only a portion of the conductor elements in each conductor unit have a decreasing electrically conductive cross-section, with at least one conductor element in each conductor unit having a constant electrically conductive cross-section.

7. The improvement of claim 1, wherein each conductor unit has a central axis disposed at a substantially constant distance along the longitudinal extent of said conductor sheath.

8. The improvement of claim 1, wherein each conductor unit has a central axis disposed at a smaller distance from said conductor sheath at an axial center of said antenna structure than at the end faces of said antenna structure.

9. In an antenna structure for exciting a substantially homogeneous magnetic RF field and/or for receiving corresponding RF signals in a nuclear magnetic resonances tomography apparatus, said antenna structure having a hollow cylindrical conductor sheath transmissive at low frequencies for gradient magnetic fields, a plurality of conductor units forming at least one conductor pair disposed within said conductor sheath and extending in a longitudinal direction of the apparatus, and means at the end faces of the conductor units for reflecting the waves of the RF field, the improvement comprising:
   each of said conductor units having a tapering electrically conductive cross-section extending symmetrically from a largest cross-section at an axial center of said antenna structure to a smallest cross-section at said end faces of said conductor units.

10. The improvement of claim 9, wherein said conductor units taper continuously from said axial center to said end faces.

11. The improvement of claim 9, wherein said conductor units taper in steps from said axial center to said end faces.

12. The improvement of claim 9, wherein each conductor unit consists of a plurality of conductor elements, with at least one conductor element in each conductor unit having a constant electrically conductive cross-section.

13. In an antenna structure for exciting a substantially homogeneous magnetic RF field and/or for receiving corresponding RF signals in a nuclear magnetic resonances tomography apparatus, said antenna structure having a hollow cylindrical conductor sheath transmissive at low frequencies for gradient magnetic fields, a plurality of conductor units forming at least one conductor pair disposed within said conductor sheath and extending in a longitudinal direction of the apparatus, and means at the end faces of the conductor units for reflecting the waves of the RF field, the improvement comprising:
   each conductor unit having an electrically conductive cross-section which varies along the longitudinal direction of said antenna structure, the variation in cross-section being selected for obtaining a substantially uniform current distribution along the full longitudinal extent of said antenna structure.

14. The improvement of claim 13, wherein said conductor unit cross-section decreases from a largest cross-section at an axial center of said antenna structure to a smallest cross-section at said end faces of said conductor units.

* * * * *